(12) United States Patent
Pillarisetty et al.

(10) Patent No.: US 9,905,651 B2
(45) Date of Patent: Feb. 27, 2018

(54) GE AND III-V CHANNEL SEMICONDUCTOR DEVICES HAVING MAXIMIZED COMPLIANCE AND FREE SURFACE RELAXATION

(71) Applicant: Intel Corporation, Santa Clara, CA (US)

(72) Inventors: Ravi Pillarisetty, Portland, OR (US); Sansaptak Dasgupta, Hillsboro, OR (US); Niti Goel, Portland, OR (US); Van H. Le, Portland, OR (US); Marko Radosavljevic, Beaverton, OR (US); Gilbert Dewey, Hillsboro, OR (US); Niloy Mukherjee, Portland, OR (US); Matthew V. Metz, Portland, OR (US); Willy Rachmady, Beaverton, OR (US); Jack T. Kavalieros, Portland, OR (US); Benjamin Chu-Kung, Portland, OR (US); Harold W. Kennel, Portland, OR (US); Stephen M. Cea, Hillsboro, OR (US); Robert S. Chau, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/405,182

(22) Filed: Jan. 12, 2017

(65) Prior Publication Data

US 2017/0125524 A1 May 4, 2017

Related U.S. Application Data

(62) Division of application No. 14/914,102, filed as application No. PCT/US2013/062447 on Sep. 27, 2013, now Pat. No. 9,570,614.

(51) Int. Cl.
*H01L 29/10* (2006.01)
*H01L 29/16* (2006.01)
(Continued)

(52) U.S. Cl.
CPC .... *H01L 29/1054* (2013.01); *H01L 21/76224* (2013.01); *H01L 29/0653* (2013.01);
(Continued)

(58) Field of Classification Search
CPC ....... H01L 21/76224; H01L 21/823431; H01L 21/823437; H01L 21/823462;
(Continued)

(56) References Cited

U.S. PATENT DOCUMENTS 8,847,281 B2 9/2014 Cea et al.
2004/0061178 A1 4/2004 Lin et al.
(Continued)

FOREIGN PATENT DOCUMENTS

JP 2011119724 6/2011

OTHER PUBLICATIONS

Non-Final Office Action and Search Report for Taiwanese Patent Application No. 105117201 dated Feb. 7, 2017, 5 pgs, with English translation.
(Continued)

*Primary Examiner* — Shahed Ahmed
(74) *Attorney, Agent, or Firm* — Schwabe, Williamson & Wyatt P.C.

(57) ABSTRACT

Ge and III-V channel semiconductor devices having maximized compliance and free surface relaxation and methods of fabricating such Ge and III-V channel semiconductor devices are described. For example, a semiconductor device includes a semiconductor fin disposed above a semiconductor substrate. The semiconductor fin has a central protruding or recessed segment spaced apart from a pair of protruding
(Continued)

outer segments along a length of the semiconductor fin. A cladding layer region is disposed on the central protruding or recessed segment of the semiconductor fin. A gate stack is disposed on the cladding layer region. Source/drain regions are disposed in the pair of protruding outer segments of the semiconductor fin.

17 Claims, 8 Drawing Sheets

(51) Int. Cl.
    *H01L 29/165*     (2006.01)
    *H01L 29/20*     (2006.01)
    *H01L 29/267*     (2006.01)
    *H01L 29/78*     (2006.01)
    *H01L 29/06*     (2006.01)
    *H01L 29/66*     (2006.01)
    *H01L 21/762*     (2006.01)

(52) U.S. Cl.
    CPC ............ *H01L 29/16* (2013.01); *H01L 29/165* (2013.01); *H01L 29/20* (2013.01); *H01L 29/267* (2013.01); *H01L 29/66795* (2013.01); *H01L 29/7851* (2013.01)

(58) Field of Classification Search
    CPC . H01L 27/0886; H01L 29/0653; H01L 29/16; H01L 29/165; H01L 29/7842; H01L 29/785; H01L 29/7851; H01L 29/20; H01L 29/267; H01L 29/66545; H01L 29/66795
    USPC ......... 257/288, 368, 369; 438/151, 197, 199
    See application file for complete search history.

(56) References Cited

U.S. PATENT DOCUMENTS

| | | |
|---|---|---|
| 2009/0206404 A1 | 8/2009 | Pillarisetty et al. |
| 2010/0252862 A1 | 10/2010 | Ko et al. |
| 2011/0057269 A1 | 3/2011 | Wilson et al. |
| 2011/0133292 A1 | 6/2011 | Lee et al. |
| 2011/0175166 A1* | 7/2011 | Bedell .................... H01L 21/845 257/351 |
| 2012/0319211 A1 | 12/2012 | Van Dal et al. |
| 2013/0015529 A1 | 1/2013 | Zhong et al. |
| 2013/0052793 A1 | 2/2013 | Shieh et al. |
| 2013/0056795 A1 | 3/2013 | Wu et al. |
| 2013/0334613 A1* | 12/2013 | Moroz ................ G06F 17/5072 257/401 |
| 2014/0252488 A1* | 9/2014 | Fu ...................... H01L 29/66795 257/368 |
| 2014/0317581 A1 | 10/2014 | Chuang et al. |
| 2015/0162435 A1* | 6/2015 | Sahu ..................... H01L 29/785 257/401 |

OTHER PUBLICATIONS

Extended European Search Report for European Patent Application No. 13894881.5 dated Apr. 11, 2017, 7 pgs.
International Search Report and Written Opinion from PCT/US2013/062447 dated Jun. 30, 2014, 9 pgs.
Non-Final Office Action for Taiwan Patent Application No. 103132259 dated Jan. 12, 2016. 3 pgs.
International Preliminary Report on Patentability from PCT/US2013/062447 dated Apr. 7, 2016, 6 pgs.

* cited by examiner

GE AND III-V CHANNEL SEMICONDUCTOR DEVICES HAVING MAXIMIZED COMPLIANCE AND FREE SURFACE RELAXATION

CROSS-REFERENCE TO RELATED APPLICATIONS

This application is a divisional of U.S. patent application Ser. No. 14/914,102, filed on Feb. 24, 2016, which is a U.S. National Phase application under 35 U.S.C. § 371 of International Application No. PCT/US2013/062447, filed Sep. 27, 2013, entitled "GE AND III-V CHANNEL SEMICONDUCTOR DEVICES HAVING MAXIMIZED COMPLIANCE AND FREE SURFACE RELAXATION" the entire contents of which are incorporated herein by reference.

TECHNICAL FIELD

Embodiments of the invention are in the field of semiconductor devices and processing and, in particular, Ge and III-V channel semiconductor devices having maximized compliance and free surface relaxation and methods of fabricating such Ge and III-V channel semiconductor devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as fin field effect transistors (fin-FETs), have become more prevalent as device dimensions continue to scale down. In conventional processes, fin-FETs are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 2A illustrates a plan view and cross-sectional view depicting a semiconductor fin having a total length of 2× gate pitch, but having a central segment isolated from outer segments;

FIG. 2B illustrates a cross-sectional view depicting growth of a cladding layer on the structure of FIG. 2A; and FIG. 2C illustrates a cross-sectional view depicting formation of a gate line and source/drain contacts on the structure of FIG. 2B.

FIG. 3A illustrates a plan view and cross-sectional view depicting a semiconductor fin having a total length of 2× gate pitch, but having a central segment isolated from outer segments;

FIG. 3B illustrates a cross-sectional view depicting recessing of the central segment of the fin of FIG. 3A;

FIG. 3C illustrates a cross-sectional view depicting growth of a cladding layer on the structure of FIG. 3B; and FIG. 3D illustrates a cross-sectional view depicting formation of a gate line and source/drain contacts on the structure of FIG. 3C.

DESCRIPTION OF THE EMBODIMENTS

Figure 1A:
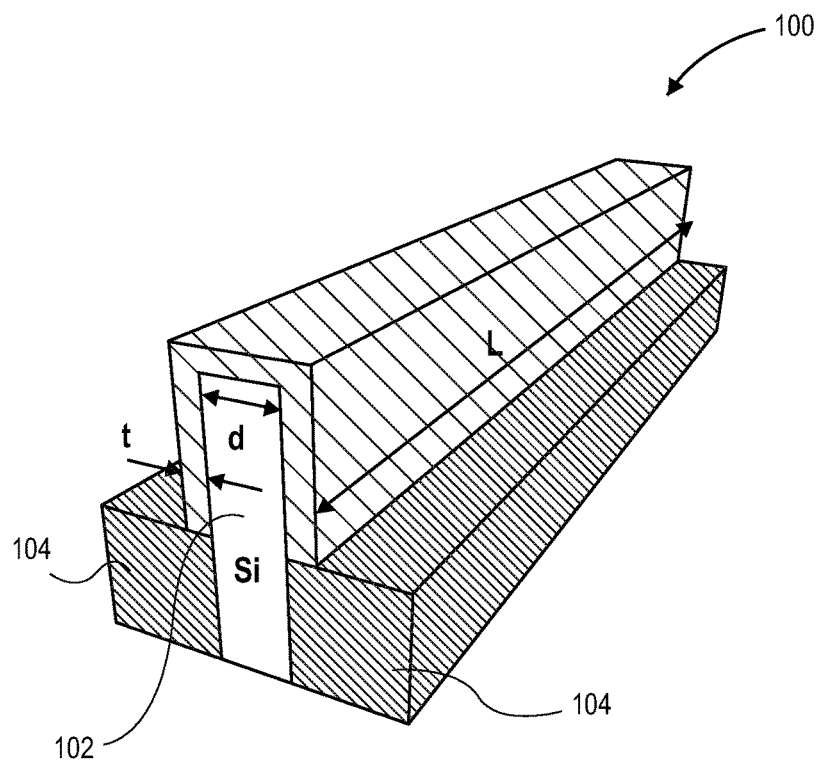
FIG. 1A illustrates an angled three-dimensional cross-sectional view of a state-of-the-art Ge/III-V-on Si non-planar device.

Ge and III-V channel semiconductor devices having maximized compliance and free surface relaxation and methods of fabricating such Ge and III-V channel semiconductor devices are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One potential way to integrate high mobility channel materials on silicon (Si) is with thin cladding layers on Si nanoscale templates. One or more embodiments described herein are directed to techniques for maximizing compliance and free surface relaxation in germanium (Ge) and III-V Transistors. One or more embodiments may be directed to one or more of cladding layers, compliant expitaxy, germanium channel regions, III-V material channel regions, transistor fabrication including metal oxide semiconductor (MOS) and complementary metal oxide semiconductor (CMOS) devices, and compound semiconductor (III thru V) devices.

More specifically, one or more embodiments described herein provides approaches for improving epitaxial growth quality of compliant III-V and Ge channel transistor devices. To provide context, for state of the art trigate transistors, fin length is set at approximately 2× gate pitch. Hence, if used, cladding layers must be grown on fins of this length. By contrast, one or more embodiments described herein decouples the active channel fin length from the typical fin length set at 2× gate pitch. Such decoupling can enable improved compliant growth on shorter fin portions or segments. Additionally, in one such embodiment, the active channel fin can also be recessed, to provide further improved compliance/free surface relaxation for the most ideal III-V material or Ge epitaxial growth in the channel region of high performance devices.

A compliant substrate, or a non-planar semiconductor body having a cladding layer to provide a compliance effect typically involves growing a Ge or III-V film on a thin fin silicon fin or substrate. Such an arrangement allows not only the film being deposited but also the thin Si-Fin (compliant) to accommodate some of the lattice mismatch and strain in the films, enabling defect reduction. As a reference point, a silicon fin having a cladding layer formed thereon can provide a compliant substrate. The cladding layer of Ge or III-V is formed on a portion of the fin to provide a high mobility channel layer. The cladding layer has a larger lattice constant than the silicon fin and, as such, both layers are strained. Compliance of the fin to the cladding layer may be achieved when a narrow fin Wsi is used, resulting in a beneficial free surface effect. In particular, the thin silicon fin and cladding layer ultimately "comply" or stretch to accommodate epitaxial growth at free surfaces thereof.

Figure 1B:
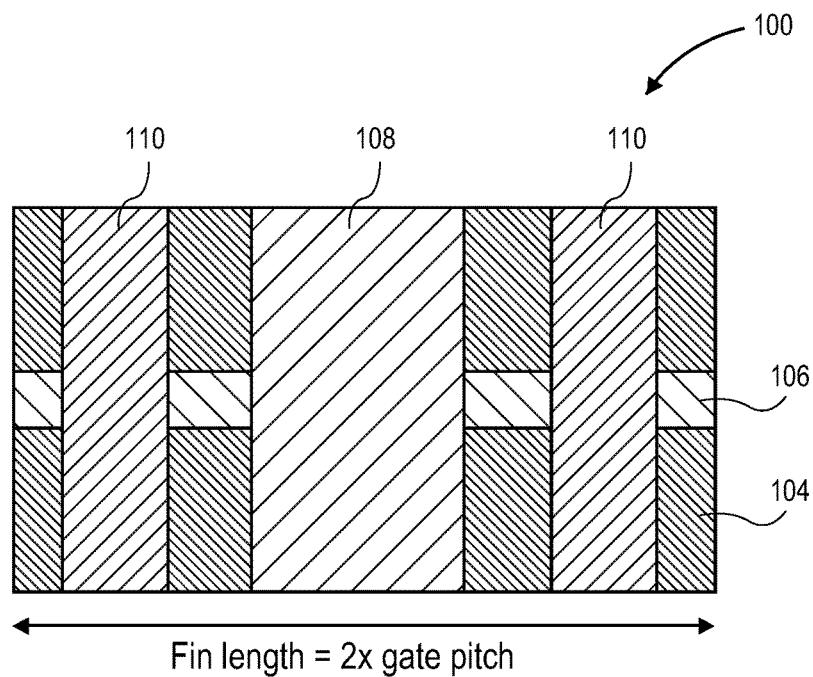
FIG. 1B illustrates a plan view of the Ge/III-V-on Si non-planar device of FIG. 1A having a gate line and source/drain contacts thereon.

As mentioned above, state of the art non-planar devices have a fin length set at twice the gate line pitch. A cladding layer formed on such a fin, e.g., a silicon fin, is formed on the entire length of the fin. The resulting compliance effect may not be optimal on such a scale, and an increased number of defects may result. As an example of a prior approach, FIGS. 1A and 1B illustrate an angled three-dimensional cross-sectional view and a plan view, respectively, of a Ge/III-V-on Si non-planar device. Referring to FIG. 1A, a device 100 includes a silicon fin 102 having a width (d) and a length (L). The silicon fin 102 is shown as a bulk silicon fin in that the fin extends through an isolation region 104 and coupled to an underlying silicon substrate (not shown). A Ge or III-V material cladding layer 106 is disposed on the surface of the exposed or protruding portion of fin 102. As shown in FIG. 1A, the cladding layer has a thickness (t) and extends along the entire length (L) of the fin 102. Referring to FIG. 1B, the device 100 is shown from above the fin with a gate line 108 and source/drain contacts 110 formed over the fin, i.e., formed over the cladding layer 106. As shown in FIG. 1B, the fin 102 has a length equal to twice the gate pitch. As such, the cladding layer 106 of device 100 runs a length of twice the gate line pitch.

Figure 1C:
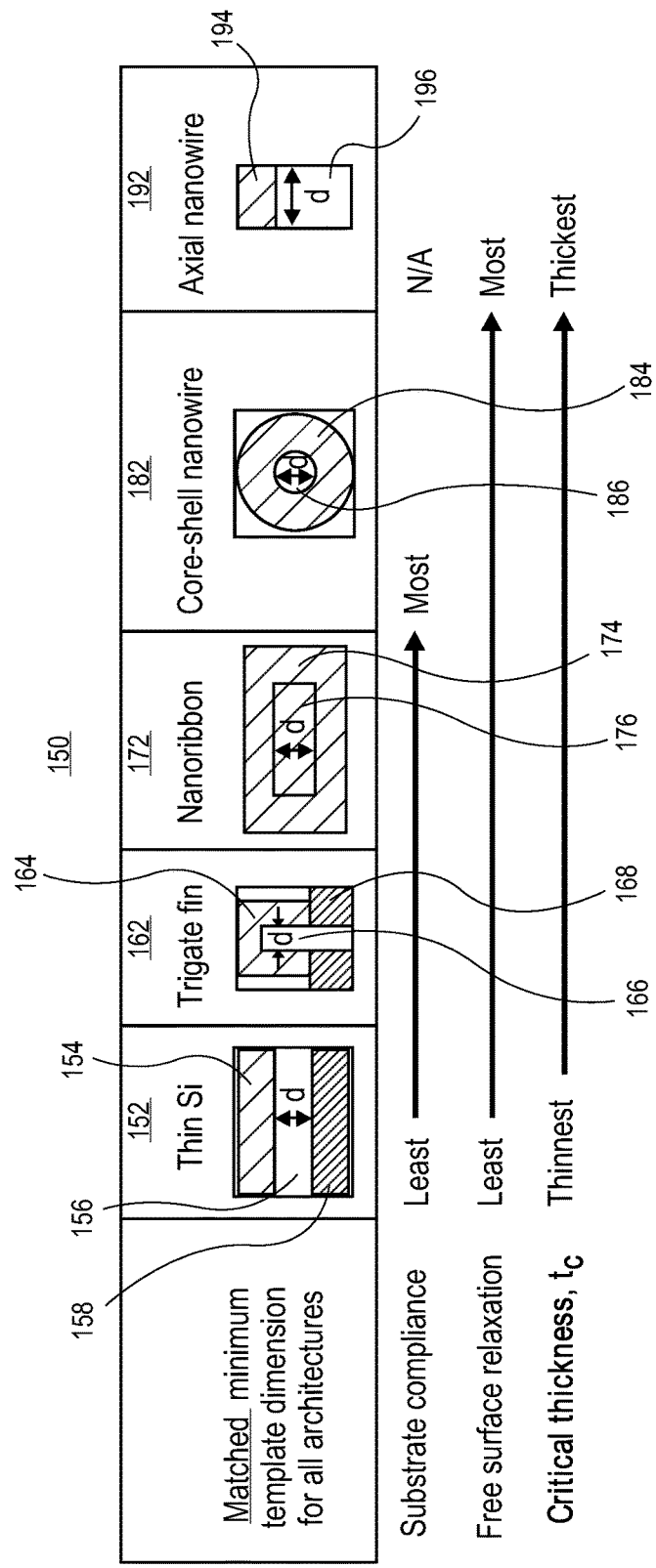
FIG. 1C is a plot showing relative cladding layer parameters for a variety of device architectures, in accordance with an embodiment of the present invention.

FIG. 1C is a plot 150 showing relative cladding layer parameters for a variety of device architectures, in accordance with an embodiment of the present invention. Referring to plot 150, matched minimum template dimensions are determined for a thin silicon device 152 having a cladding layer 154 on an active region 156 with a thickness (d) above an isolation layer 158, for a conventional trigate fin device 162 having a cladding layer 164 on an active region 166 with a width (d) and protruding above an isolation layer 168, for a nanoribbon device 172 having a cladding layer 174 surrounding an active region 176 having a height (d), for a core-shell nanowire device 182 having a cladding layer 184 surrounding an active region 186 having a diameter (d), and for an axial nanowire 192 having a cladding layer 194 on an active region 196 with a width (d). Relative substrate compliance, free surface relaxation and critical thickness ($t_C$) are shown in plot 150 for devices 152, 162, 172, 182 and 192. Referring again to FIG. 1C, one potential drawback to a traditional trigate device is that fin length is tied to gate pitch which requires that (i) the entire fin length (which is 2× gate pitch) has to be cladded, (ii) the active cladded fin channel cannot be made shorter because of this constraint (which would otherwise be an improvement for compliance), and (iii) the axial cladding structure in the active channel cannot be utilized, which would otherwise provide an optimal structure for compliance.

In contrast to the cladded trigate structure of FIGS. 1A and 1B, which is benchmarked in FIG. 1C, generally, one or more embodiments described herein provide an approach to fabricating shorter fin Si base segments for improved growth/compliance. In a first example, FIGS. 2A-2C illustrate cross-sectional views of various operations in a method of fabricating a short fin device with a retained 2× gate pitch accommodation, in accordance with an embodiment of the present invention.

Figure 2A:
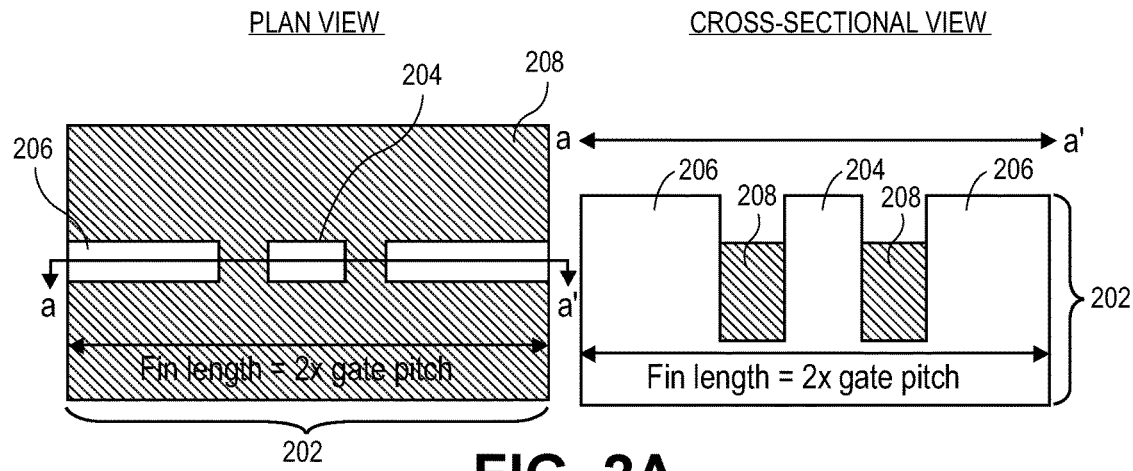
FIGS. 2A-2C illustrate cross-sectional views of various operations in a method of fabricating a short fin device with a retained 2× gate pitch accommodation, in accordance with an embodiment of the present invention, where.

Referring to FIG. 2A, a plan view and cross-sectional view depict a semiconductor fin 202 having a total length of 2× gate pitch, but having a central segment 204 isolated from outer segments 206. The fin 202 protrudes above an isolation region 208 which is further disposed between the central segment 204 and the outer segments 206 of the fin 202. As such, fin 202 effectively represents a conventional fin cut into three segments. In one embodiment, the fin 202 is a bulk silicon fin silicon and the isolation region is composed of silicon dioxide, as shown. In an embodiment, in keeping with traditional bulk trigate manufacturing approaches, the fin 202 is first formed within an underlying bulk substrate. An isolation material is then formed over the fin and subsequently recessed to expose the protruding portions of the fin. In accordance with an embodiment of the present invention, however, fin formation further includes cutting of the segments as shown (e.g., by a patterning and etch process) prior to isolation deposition and recessing. It is to be appreciated that the resulting fin 202 is a single fin as shown along source to drain regions, and is not merely a plurality of fins.

Figure 2B:
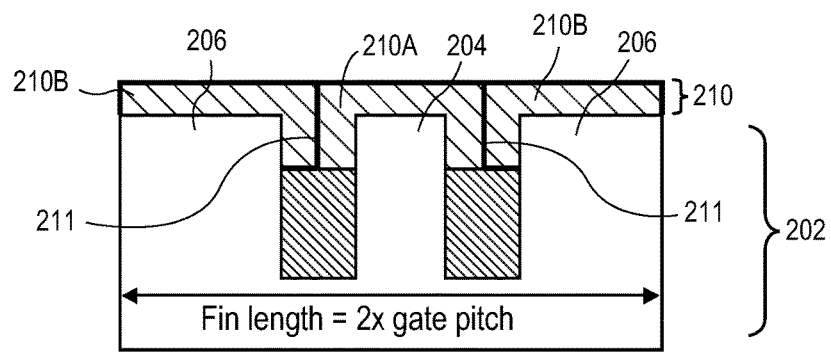

Referring to FIG. 2B, a cross-sectional view depicts growth of a cladding layer 210 on the structure of FIG. 2A. In particular, the cladding layer 210 is grown epitaxially on the central segment 204 and the outer segments 206 of the fin 202. However, instead of growing a single cladding layer region along the entire length of the fin, a first cladding layer region 210A is grown on the central segment 204 of the fin 202. Second cladding layer regions 210B are grown on the outer segments 206 of the fin 202. The cladding layer regions 210A and 210B merge at interfaces 211. However, the cladding layer region 210A is formed as a distinct region. This enables the highest quality cladding layer growth, and best substrate compliance, since the growth of region 210A is confined to the central segment 204 of fin 202. The effect is to shorten the length of the grown cladding layer 210A relative to the entire length of the fin. By reducing the length, the compliance is enhanced at the channel region of the fin 202, where it is most needed. It is to be appreciated that the regions 210B very well may run along longer portions of the fin 202 and, accordingly, have less compliance effect and/or have lower quality than region 210A.

Figure 2C:
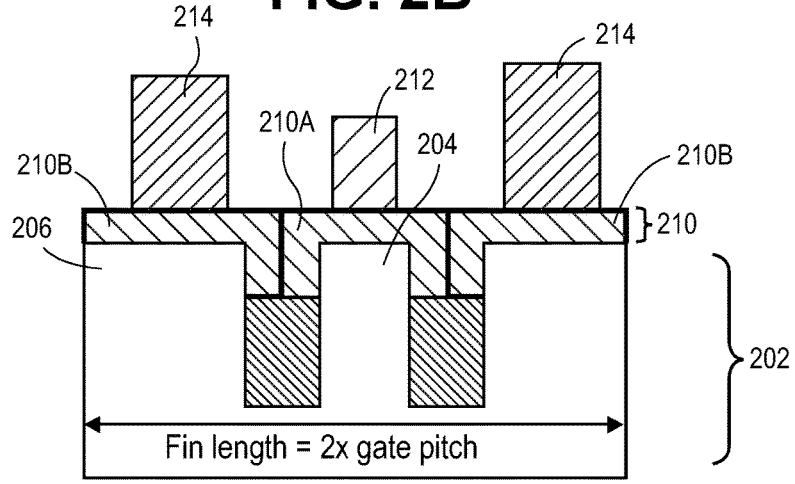

Referring to FIG. 2C, a cross-sectional view depicts formation of a gate line 212 and source/drain contacts 214 on the structure of FIG. 2B. In particular, the gate line 212 is formed above/over the cladding layer region 210A. The source/drain contacts 214 are formed above/over the cladding layer regions 210B. The resulting device, then, provides a high compliance cladding layer region 210A underneath the gate line 212. The total fin 202 of the semiconductor device includes the regions 206 and 204 along with cladding layer regions 210A and 210B. It is to be appreciated that the structure of FIG. 2C may subsequently be subjected to further processing, such as back end metallization, in order to incorporate the device into an integrated circuit such as a CMOS integrated circuit.

In a second example, FIGS. 3A-3D illustrate cross-sectional views of various operations in a method of fabricating a fin device with axial channel growth and a retained 2× gate pitch accommodation, in accordance with an embodiment of the present invention.

Figure 3A:
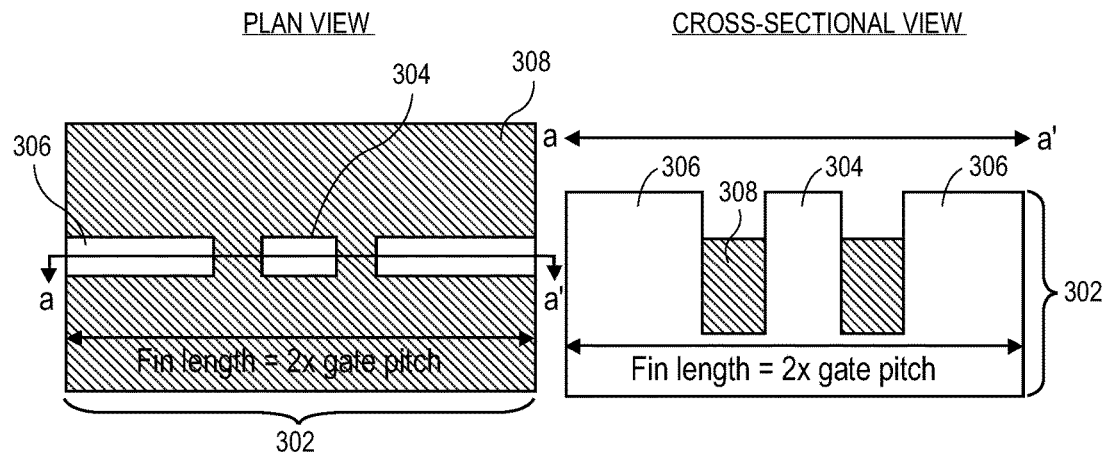
FIGS. 3A-3D illustrate cross-sectional views of various operations in a method of fabricating a fin device with axial channel growth and a retained 2× gate pitch accommodation, in accordance with an embodiment of the present invention, where.

Referring to FIG. 3A, a plan view and cross-sectional view depict a semiconductor fin 302 having a total length of 2× gate pitch, but having a central segment 304 isolated from outer segments 306. The fin 302 protrudes above an isolation region 308 which is further disposed between the central segment 304 and the outer segments 306 of the fin 302. As such, fin 302 effectively represents a conventional fin cut into three segments. In one embodiment, the fin 302 is a bulk silicon fin silicon and the isolation region is composed of silicon dioxide, as shown. In an embodiment, in keeping with traditional bulk trigate manufacturing approaches, the fin 302 is first formed within an underlying bulk substrate. An isolation material is then formed over the fin and subsequently recessed to expose the protruding portions of the fin. In accordance with an embodiment of the present invention, however, fin formation further includes cutting of the segments as shown (e.g., by a patterning and etch process) prior to isolation deposition and recessing.

Figure 3B:
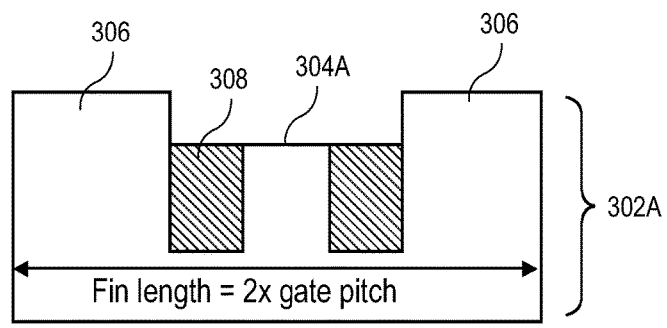

Referring to FIG. 3B, a cross-sectional view depicts recessing of the central segment 304 of the fin 302. In particular, the central segment 304 is recessed to provide a recessed central segment 304A of a modified fin 302A. It is to be appreciated that the resulting fin 302A is a single fin as shown along source to drain regions, and is not merely a plurality of fins. The recessing may be performed by a patterning and etch process. In one embodiment, the recessing is performed to provide the recessed central segment 304A at approximately the level of the isolation region 308, as is depicted in FIG. 3B.

Figure 3C:
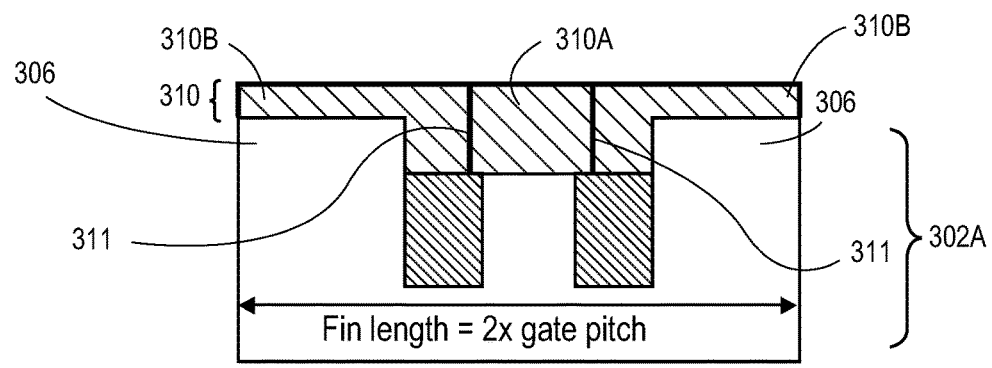

Referring to FIG. 3C, a cross-sectional view depicts growth of a cladding layer 310 on the structure of FIG. 3B. In particular, the cladding layer 310 is grown epitaxially on the recessed central segment 304A and the outer segments 306 of the fin 302. However, instead of growing a single cladding layer region along the entire length of the fin, a first cladding layer region 310A is grown on the recessed central segment 304A of the fin 302A. Second cladding layer regions 310B are grown on the outer segments 306 of the fin 302A. The cladding layer regions 310A and 310B merge at interfaces 311. However, the cladding layer region 310A is formed as a distinct region. This enables the highest quality cladding layer growth, and best substrate compliance, since the growth of region 310A is confined to the recessed central segment 304A of fin 302A. The effect is to shorten the length of the grown cladding layer 310A relative to the entire length of the fin. By reducing the length, the compliance is enhanced at the channel region of the fin 302A, where it is most needed. It is to be appreciated that the regions 310B very well may run along longer portions of the fin 302A and, accordingly, have less compliance effect and/or have lower quality than region 310A.

Figure 3D:
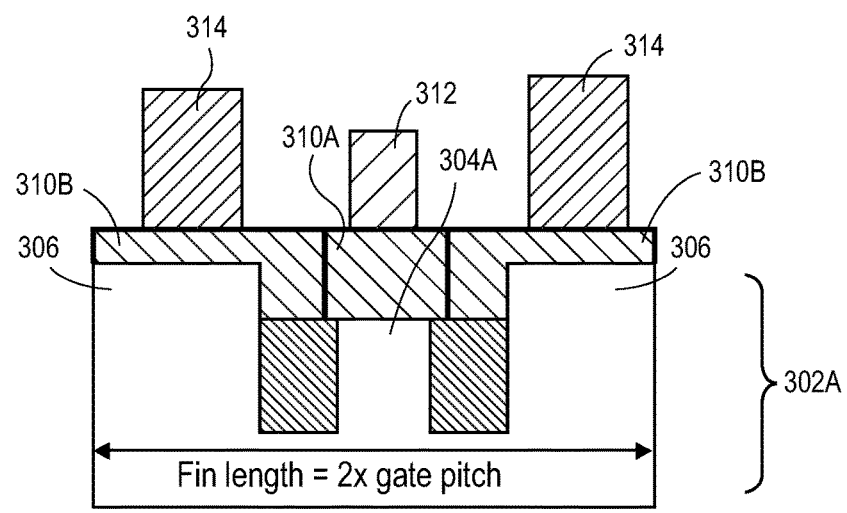

Referring to FIG. 3D, a cross-sectional view depicts formation of a gate line 312 and source/drain contacts 314 on the structure of FIG. 3C. In particular, the gate line 312 is formed above/over the cladding layer region 310A. The source/drain contacts 314 are formed above/over the cladding layer regions 310B. The resulting device, then, provides a high compliance cladding layer region 310A underneath the gate line 312. The total fin 302A of the semiconductor device includes the regions 306 and 304A along with cladding layer regions 310A and 310B. It is to be appreciated that the structure of FIG. 3D may subsequently be subjected to further processing, such as back end metallization, in order to incorporate the device into an integrated circuit such as a CMOS integrated circuit.

In an embodiment, the cladding layer 310 has a lower band gap yet larger lattice constant than underlying Si. The cladding layer 310 may have a thickness suitable to propagate a substantial portion of a wave-function, e.g. suitable to inhibit a significant portion of the wave-function from entering the Si fin. However, the cladding layer 310 may be sufficiently thin for compliance. In one embodiment, cladding layer 310 has a thickness approximately in the range of 10-50 Angstroms. The cladding layer 310 may be formed by a technique such as, but not limited to, chemical vapor deposition (CVD) or molecular beam epitaxy (MBE), or other like processes.

In a first embodiment, the cladding layer 310 is a germanium (Ge) cladding layer, such as a pure or essentially pure germanium cladding layer. As used throughout, the terms pure or essentially pure germanium may be used to describe a germanium material composed of a very substantial amount of, if not all, germanium. However, it is to be understood that, practically, 100% pure Ge may be difficult to form and, hence, could include a tiny percentage of Si. The Si may be included as an unavoidable impurity or component during deposition of Ge or may "contaminate" the Ge upon diffusion during post deposition processing. As such, embodiments described herein directed to a Ge cladding layer may include Ge materials that contain a relatively small amount, e.g., "impurity" level, non-Ge atoms or species, such as Si. Also, in alternative embodiments, SiGe is used, e.g., a $Si_xGe_y$ layer, where $0<x<100$, and $0<y<100$, with a high % Ge content relative to silicon.

In a second embodiment, the cladding layer 310 is a III-V material cladding layer. That is, in one embodiment, the cladding layer 310 is composed of groups III (e.g. boron, aluminum, gallium or indium) and V (e.g. nitrogen, phosphorous, arsenic or antimony) elements. In one embodiment, cladding layer 310 is composed of binary (e.g., GaAs) but can also be ternary or quarternary based III-V materials, etc.

As mentioned above, in one embodiment, the illustrations of FIGS. 2A and 3A begins the processss flow descriptions post fin etch and shallow trench isolation (STI) polish following isolation oxide deposition. It is to be appreciated that artifacts that may have at one point remained from the fabrication of fins 202 or 302 have also been removed. For example, in one embodiment, a hardmask layer, such as a silicon nitride hardmask layer, and a pad oxide layer, such as a silicon dioxide layer, have been removed from the top surface of fins 202 or 302. In one embodiment, a corresponding bulk substrate and, hence, the fins 202 or 302, are undoped or lightly doped at this stage. For example, in a particular embodiment, the bulk substrate and, hence, the fins 202 or 302, have a concentration of less than approximately 1E17 atoms/cm$^3$ of boron dopant impurity atoms. However, in other embodiments, well and/or retrograde implants have been, or will be, provided to the fins 202 or 302 and the underlying substrate. In one such example, such doping of the exposed fins 202 or 302 may lead to doping within the corresponding bulk substrate portion, where adjacent fins share a common doped region in the bulk substrate.

In an embodiment, referring again to FIGS. 2A and 3A, the dielectric layer 208 or 308 is composed of silicon dioxide, such as is used in a shallow trench isolation fabrication process. The dielectric layer 208 or 308 may be deposited by a chemical vapor deposition (CVD) or other deposition process (e.g., ALD, PECVD, PVD, HDP assisted CVD, low temp CVD) and may be planarized by a chemical mechanical polishing (CMP) technique. The planarization may also removes any artifacts from fin patterning, such as a hardmask layer and/or pad oxide layer, as mentioned above. In an embodiment, recessing of a dielectric layer to provide isolation regions 208 or 308 defines the initial Si channel height (HSI). The recessing may be performed by a plasma, vapor or wet etch process. In one embodiment, a dry etch process selective to silicon fins 202 or 302 is used, the dry etch process based on a plasma generated from gases such as, but not limited to, NF$_3$, CHF$_3$, C$_4$F$_8$, HBr and O$_2$ with typically pressures in the range of 30-100 mTorr and a plasma bias of 50-1000 Watts. In the case of the process described in association with FIGS. 2A-2C, the initial Si channel height (HSI) is retained. However, the case of the process described in association with FIGS. 3A-3D, the initial Si channel height (HSI) is reduced upon recessing of the central fin portion. It is to be appreciated that cladding layer growth for compliant substrate fabrication increases the total fin height which is based on HSI and top cladding layer thickness.

In an embodiment, gate line 212 or 312 patterning involves poly lithography to define a polysilicon gate (permanent or placeholder for a replacement gate process) by etch of an SiN hardmask and polysilicon subsequently. In one embodiment, a mask is formed on the hardmask, the mask composed of a topographic masking portion and an anti-reflective coating (ARC) layer. In a particular such embodiment, the topographic masking portion is a carbon hardmask (CHM) layer and the anti-reflective coating layer is a silicon ARC layer. The topographic masking portion and the ARC layer may be patterned with conventional lithography and etching process techniques. In one embodiment, the mask also includes and uppermost photo-resist layer, as is known in the art, and may be patterned by conventional lithography and development processes. In a particular embodiment, the portions of the photo-resist layer exposed to the light source are removed upon developing the photo-resist layer. Thus, patterned photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra violet (EUV) resist, an e-beam imprint layer, or a phenolic resin matrix with a diazonaphthoquinone sensitizer. In another particular embodiment, the portions of the photo-resist layer exposed to the light source are retained upon developing the photo-resist layer. Thus, the photo-resist layer is composed of a negative photo-resist material. In a specific embodiment, the photo-resist layer is composed of a negative photo-resist material such as, but not limited to, consisting of poly-cis-isoprene or poly-vinyl-cinnamate.

Figure 4:
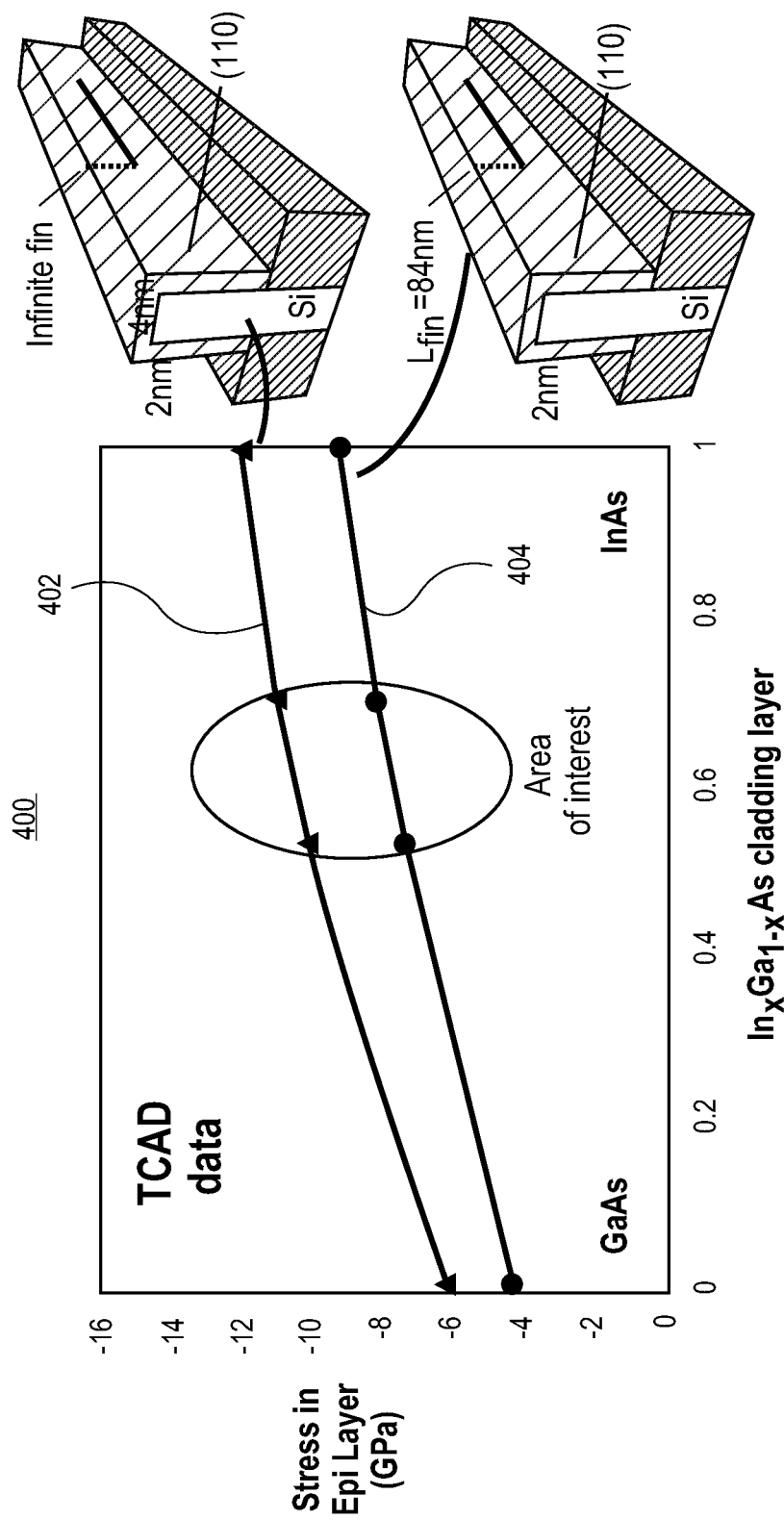
FIG. 4 is a plot of simulated epitaxial layer stress (in GPa) as a function of cladding layer composition, in accordance with an embodiment of the present invention.

Pertinent to the structures shown in both FIGS. 2C and 3D, FIG. 4 is a plot 400 of simulated epitaxial layer stress (in GPa) as a function of cladding layer composition, in accordance with an embodiment of the present invention. Referring to plot 400, stress of an InxGal-xAs cladding layer on a silicon fin is plotted as a function of increasing value for x. Data line 402 represents stress for a 2 nm thick cladding layer on a 4 nm wide Si fin of infinite length. Data line 404 represents stress for a 2 nm thick cladding layer on a 4 nm wide Si fin of 84 nm length. The relative stress is lowered in shorter fins due to free surface relaxation.

In general, referring again to FIGS. 2A-2C and 3A-3D, in an embodiment, the approach described can be used for N-type (e.g., NMOS) or P-type (e.g., PMOS), or both, device fabrication. It is to be understood that the structures resulting from the above exemplary processing schemes, e.g., the structures from FIGS. 2C and 3D, may be used in a same or similar form for subsequent processing operations to complete device fabrication, such as PMOS and NMOS device fabrication. As an example of a completed device, FIGS. 5A and 5B illustrate a cross-sectional view and a plan view (taken along the a-a' axis of the cross-sectional view), respectively, of a Ge or III-V channel semiconductor devices having maximized compliance and free surface relaxation, in accordance with an embodiment of the present invention.

Figure 5A:
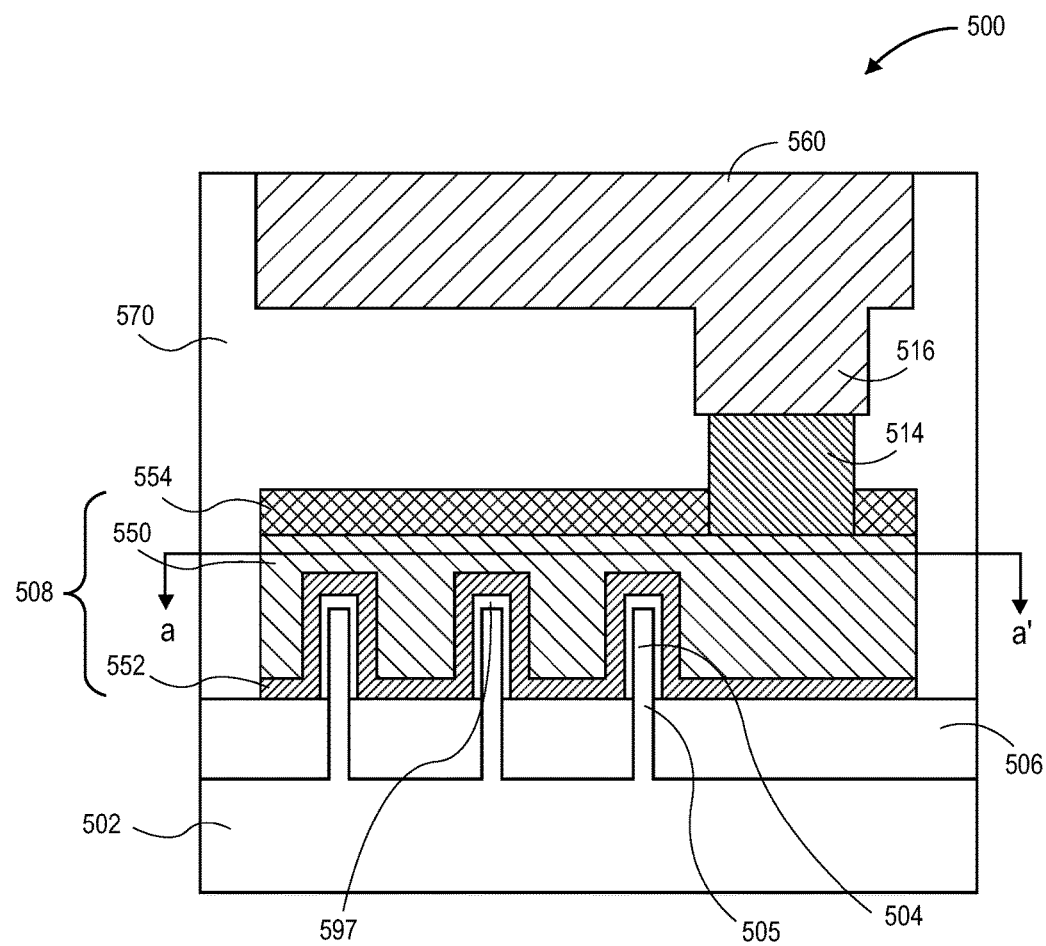
FIG. 5A illustrates a cross-sectional view of a Ge or III-V channel semiconductor device having maximized compliance and free surface relaxation, in accordance with an embodiment of the present invention.

Referring to FIG. 5A, a semiconductor structure or device 500 includes a non-planar active region (e.g., a fin structure including protruding fin portion 504 and sub-fin region 505) formed from substrate 502, and within isolation region 506. In the case shown, three distinct fins are included in a single device. A channel region cladding layer 597 is formed to surround the protruding region 504 of each of the fins. Although not shown, it is to be appreciated that the cladding layer 597 of each fin (as considered in a direction normal to the page) does not run the length of the entire fin. Instead, it is shortened in the manner described in association with FIGS. 2A-2C and 3A-3D to provide an enhanced compliance effect.

Referring again to FIG. 5A, a gate line 508 is disposed over the protruding portions 504 of the non-planar active region as well as over a portion of the isolation region 506. As shown, gate line 508 includes a gate electrode 550 and a gate dielectric layer 552. In one embodiment, gate line 508 may also include a dielectric cap layer 554. A gate contact 514, and overlying gate contact via 516 are also seen from this perspective, along with an overlying metal interconnect 560, all of which are disposed in inter-layer dielectric stacks or layers 570. Also seen from the perspective of FIG. 5A, the gate contact 514 is, in one embodiment, disposed over isolation region 506, but not over the non-planar active regions.

Figure 5B:
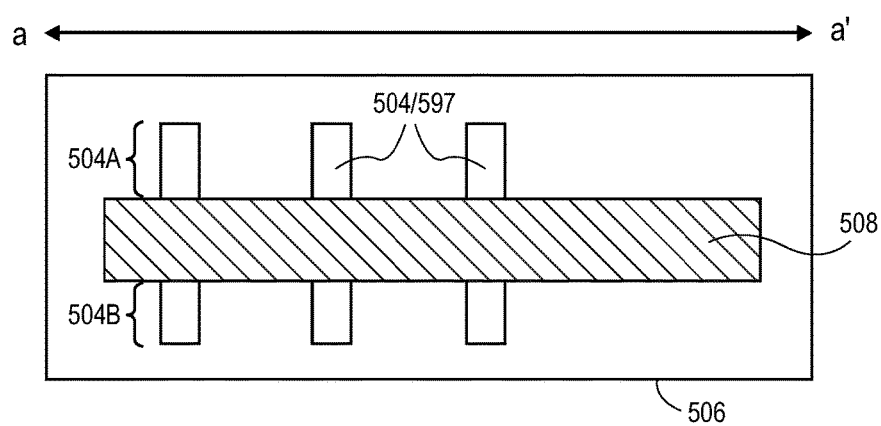
FIG. 5B illustrates a plan view taken along the a-a' axis of the semiconductor device of FIG. 5A, in accordance with an embodiment of the present invention.

Referring to FIG. 5B, the gate line 508 is shown as disposed over the protruding fin portions 504. Source and drain regions 504A and 504B of the protruding fin portions 504 can be seen from this perspective. In one embodiment, the source and drain regions 504A and 504B are doped portions of original material of the protruding fin portions 504/597. In another embodiment, the material of the protruding fin portions 504/597 is removed and replaced with another semiconductor material, e.g., by epitaxial deposition. In that case, portions of a cladding layer confined to the source and drain regions are also removed. In either case, the source and drain regions 504A and 504B may extend below the height of dielectric layer 506, i.e., into the sub-fin region 505. Alternatively, the source and drain regions 504A and 504B do not extend below the height of dielectric layer 506, and are either above or co-planar with the height of dielectric layer 506.

In an embodiment, the semiconductor structure or device 500 is a non-planar device such as, but not limited to, a fin-FET. However, a tri-gate or similar device may also be fabricated. In such an embodiment, a corresponding semiconducting channel region is composed of or is formed in a three-dimensional body. In one such embodiment, the gate electrode stacks of gate lines 508 surround at least a top surface and a pair of sidewalls of the three-dimensional body, as depicted in FIG. 5A.

Substrate 502 may be composed of a semiconductor material that can withstand a manufacturing process and in which charge can migrate. In an embodiment, substrate 502 is a bulk substrate composed of a crystalline silicon layer doped with a charge carrier, such as but not limited to phosphorus, arsenic, boron or a combination thereof, to form active region 504/505. In one embodiment, the concentration of silicon atoms in bulk substrate 502 is greater than 99%. In another embodiment, bulk substrate 502 is composed of an epitaxial layer grown atop a distinct crystalline substrate, e.g. a silicon epitaxial layer grown atop a boron-doped bulk silicon mono-crystalline substrate. Alternatively, in place of a bulk substrate, a silicon-on-insulator (SOI) substrate may be used. In a particular embodiments, substrate 502 and, hence, protruding portions 504 of the fins, is composed of single crystalline silicon, and the cladding layer 597 is a Ge cladding layer or a III-V material cladding layer, as described above.

Isolation region 506 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 506 is composed of a dielectric material such as, but not limited to, silicon dioxide, silicon oxy-nitride, silicon nitride, or carbon-doped silicon nitride.

Gate line 508 may be composed of a gate electrode stack which includes a gate dielectric layer 552 and a gate electrode layer 550. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include one or a few monolayers of native oxide formed from the top few layers of the cladding layer 597.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks (not shown) may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 514 and overlying gate contact via 516 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 500 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 508 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid. In an embodiment, replacement of a dummy gate dielectric layer with a permanent gate dielectric layer is additionally performed.

In an embodiment, one or more approaches described herein contemplate essentially a dummy and replacement gate process in combination with a dummy and replacement contact process to arrive at structure 500. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 5A, the arrangement of semiconductor structure or device 500 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be understood that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor field effect transistors (MOS) transistors for logic or memory, or are bipolar transistors. Also, in an embodiment, the semiconductor devices have a three-dimensional architecture, such as a fin-FET device, a trigate device, or an independently accessed double gate device. One or more embodiments may be particularly useful for fabricating semiconductor devices at a 14 nanometer (14 nm) or smaller technology node.

In general, then, one or more embodiments described above allow for decoupling the active channel fin length from the typical fin length=2× gate pitch. This allows for better compliant growth since the fin is shortened. Additionally, the active channel fin can also be recessed, to provide even better compliance/free surface relaxation for III-V or Ge epitaxial growth in the channel. Thus, novel high mobility materials such Ge or III-V may be introduced into the transistor channel, e.g., PMOS for the former and NMOS for the latter.

Figure 6:
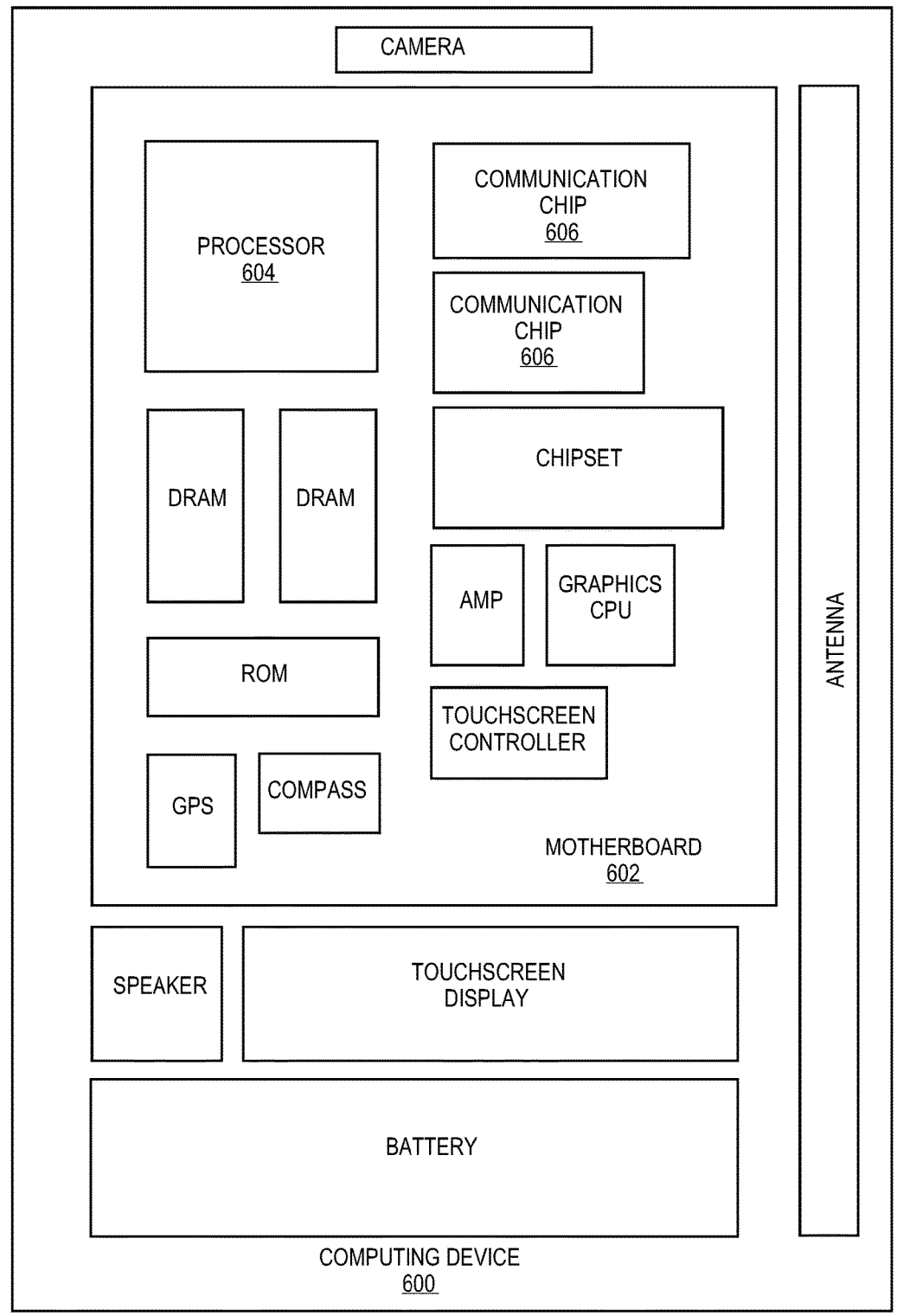
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of embodiments of the invention, the integrated circuit die of the processor includes one or more devices, such as Ge or III-V channel semiconductor devices having maximized compliance and free surface relaxation built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as Ge or III-V channel semiconductor devices having maximized compliance and free surface relaxation built in accordance with implementations of the invention.

In further implementations, another component housed within the computing device 600 may contain an integrated circuit die that includes one or more devices, such as Ge or III-V channel semiconductor devices having maximized compliance and free surface relaxation built in accordance with implementations of embodiments of the invention.

In various embodiments, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, embodiments of the present invention include Ge and III-V channel semiconductor devices having maximized compliance and free surface relaxation and methods of fabricating such Ge and III-V channel semiconductor devices.

In an embodiment, a semiconductor device includes a semiconductor fin disposed above a semiconductor substrate. The semiconductor fin has a central protruding segment spaced apart from a pair of protruding outer segments along a length of the semiconductor fin. A cladding layer region is disposed on the central protruding segment of the semiconductor fin. A gate stack is disposed on the cladding layer region. Source/drain regions are disposed in the pair of protruding outer segments of the semiconductor fin.

In one embodiment, the semiconductor device further includes a second cladding layer region disposed on one of the pair of protruding outer segments. A third cladding layer region is disposed on the other of the pair of protruding outer segments. The second and third cladding regions are discrete from, but contiguous with, the cladding layer region disposed on the central protruding segment of the semiconductor fin.

In one embodiment, the semiconductor fin and the cladding layer region together provide a compliant substrate.

In one embodiment, the central protruding segment is spaced apart from the pair of protruding outer segments by an isolation layer.

In one embodiment, the semiconductor fin consists essentially of silicon, and the cladding layer region consists essentially of germanium.

In one embodiment, the semiconductor device is a PMOS device.

In one embodiment, the semiconductor fin consists essentially of silicon, and the cladding layer region consists essentially of a III-V material.

In one embodiment, the semiconductor device is an NMOS device.

In an embodiment, a semiconductor device includes a semiconductor fin disposed above a semiconductor substrate. The semiconductor fin has a central recessed segment spaced apart from a pair of protruding outer segments along a length of the semiconductor fin. A cladding layer region is disposed on the central recessed segment of the semiconductor fin. A gate stack is disposed on the cladding layer region. Source/drain regions are disposed in the pair of protruding outer segments of the semiconductor fin.

In one embodiment, the semiconductor device further includes a second cladding layer region disposed on one of the pair of protruding outer segments. A third cladding layer region is disposed on the other of the pair of protruding outer segments. The second and third cladding regions are discrete from, but contiguous with, the cladding layer region disposed on the central recessed segment of the semiconductor fin.

In one embodiment, the semiconductor fin and the cladding layer region together provide a compliant substrate.

In one embodiment, the central recessed segment is spaced apart from the pair of protruding outer segments by an isolation layer.

In one embodiment, the semiconductor fin consists essentially of silicon, and the cladding layer region consists essentially of germanium.

In one embodiment, the semiconductor device is a PMOS device.

In one embodiment, the semiconductor fin consists essentially of silicon, and the cladding layer region consists essentially of a III-V material.

In one embodiment, the semiconductor device is an NMOS device.

In an embodiment, a method of fabricating a semiconductor device involves forming a semiconductor fin above a substrate. The method also involves etching the semiconductor fin to provide a central protruding segment spaced apart from a pair of protruding outer segments along a length of the semiconductor fin. The method also involves forming an isolation layer between the central protruding segment and each of the pair of protruding outer segments, the isolation layer having a top surface below a top surface of the central protruding segment. The method also involves, subsequent to forming the isolation layer, forming a cladding layer on exposed surfaces of the semiconductor fin. The method also involves forming a gate stack on the cladding layer. The method also involves forming source/drain regions in the pair of protruding outer segments of the semiconductor fin.

In one embodiment, the method of claim further involves, subsequent to forming the isolation region and prior to forming the cladding layer, recessing the central protruding segment to approximately the top surface of the isolation region.

In one embodiment, forming the cladding layer region involves forming a first cladding layer region on the central protruding segment, forming a second cladding layer region on one of the pair of protruding outer segments, and forming a third cladding layer region on the other of the pair of protruding outer segments. The second and third cladding regions are discrete from, but contiguous with, the first cladding layer region.

In one embodiment, forming the cladding layer region involves forming a first cladding layer region on the central recessed segment, forming a second cladding layer region on one of the pair of protruding outer segments, and forming a third cladding layer region on the other of the pair of protruding outer segments. The second and third cladding regions are discrete from, but contiguous with, the first cladding layer region.

In one embodiment, forming the cladding layer on exposed surfaces of the semiconductor fin provides a compliant substrate.

What is claimed is:

1. A semiconductor device, comprising:
    a semiconductor fin disposed above a semiconductor substrate, the semiconductor fin having a central recessed segment spaced apart from a pair of protruding outer segments along a length of the semiconductor fin;
    a cladding layer region disposed on the central recessed segment of the semiconductor fin;
    a gate stack disposed on the cladding layer region; and
    source/drain regions disposed in the pair of protruding outer segments of the semiconductor fin.

2. The semiconductor device of claim 1, further comprising:
    a second cladding layer region disposed on one of the pair of protruding outer segments; and
    a third cladding layer region disposed on the other of the pair of protruding outer segments, wherein the second and third cladding regions are discrete from, but contiguous with, the cladding layer region disposed on the central recessed segment of the semiconductor fin.

3. The semiconductor device of claim 1, wherein the semiconductor fin and the cladding layer region together provide a compliant substrate.

4. The semiconductor device of claim 1, wherein the central recessed segment is spaced apart from the pair of protruding outer segments by an isolation layer.

5. The semiconductor device of claim 1, wherein the semiconductor fin consists essentially of silicon, and the cladding layer region consists essentially of germanium.

6. The semiconductor device of claim 5, wherein the semiconductor device is a PMOS device.

7. The semiconductor device of claim 6, wherein the semiconductor fin consists essentially of silicon, and the cladding layer region consists essentially of a III-V material.

8. The semiconductor device of claim 7, wherein the semiconductor device is an NMOS device.

9. A semiconductor structure, comprising:
a semiconductor fin disposed above a semiconductor substrate, the semiconductor fin having a central recessed segment spaced apart from a first protruding outer segment and a second protruding outer segment along a length of the semiconductor fin, wherein the central recessed segment is spaced apart from the first protruding outer segment by a first isolation region, the central recessed segment is spaced apart from the second protruding outer segment by a second isolation region, and wherein an uppermost surface of the central recessed segment is co-planar with an uppermost surface of the first and second isolation regions;
a cladding layer disposed on the central recessed segment of the semiconductor fin;
a gate electrode over a top surface of the cladding layer and laterally adjacent to sidewalls of the cladding layer;
a source region in the first protruding outer segment of the semiconductor fin; and
a drain region in the second protruding outer segment of the semiconductor fin.

10. The semiconductor structure of claim 9, further comprising: a second cladding layer disposed on the first protruding outer segment; and a third cladding layer disposed on the second protruding outer segment, wherein the second and third cladding regions are discrete from, but contiguous with, the cladding layer disposed on the central recessed segment of the semiconductor fin.

11. The semiconductor structure of claim 10, wherein the source region is also in the second cladding layer, and wherein the drain region is also in the third cladding layer.

12. The semiconductor structure of claim 9, wherein the semiconductor fin and the cladding layer together provide a compliant substrate.

13. The semiconductor structure of claim 9, wherein the semiconductor fin consists essentially of silicon, and the cladding layer consists essentially of germanium.

14. The semiconductor structure of claim 13, wherein the gate electrode is a p-type gate electrode.

15. The semiconductor structure of claim 9, wherein the semiconductor fin consists essentially of silicon, and the cladding layer consists essentially of a III-V material.

16. The semiconductor structure of claim 15, wherein the gate electrode is an n-type gate electrode.

17. The semiconductor structure of claim 9, further comprising:
a gate dielectric between the gate electrode and the cladding layer.

* * * * *